United States Patent
Bellis

(10) Patent No.: US 10,432,001 B1
(45) Date of Patent: Oct. 1, 2019

(54) STACKABLE SHELF SYSTEM FOR CHARGING ELECTRICAL DEVICES

(71) Applicant: Vanessa Bellis, Bakersfield, CA (US)

(72) Inventor: Vanessa Bellis, Bakersfield, CA (US)

( * ) Notice: Subject to any disclaimer, the term of this patent is extended or adjusted under 35 U.S.C. 154(b) by 0 days.

(21) Appl. No.: 15/990,875

(22) Filed: May 29, 2018

(51) Int. Cl.
*H02J 7/00* (2006.01)
*A47B 47/02* (2006.01)
*H05K 7/18* (2006.01)
*A47B 87/02* (2006.01)
*A47B 57/56* (2006.01)
*A47F 5/10* (2006.01)
*A47B 96/02* (2006.01)
*A47B 57/04* (2006.01)

(52) U.S. Cl.
CPC .......... *H02J 7/0044* (2013.01); *A47B 47/022* (2013.01); *A47B 57/045* (2013.01); *A47B 57/56* (2013.01); *A47B 87/0215* (2013.01); *A47B 96/025* (2013.01); *A47F 5/103* (2013.01); *H02J 7/0027* (2013.01); *H05K 7/183* (2013.01)

(58) Field of Classification Search
CPC ...... H02J 7/0044; H02J 7/0027; H02J 7/0042; A47B 47/022; A47B 57/56; A47B 87/0215; A47B 2097/003; A47B 2097/006; A47B 2007/0085; A47B 2097/005; A47B 57/045; A47B 96/027; A47B 96/02; A47B 55/02; A47F 7/005; A47F 5/01; A47F 5/08; A47F 5/13; A47F 5/103; H05K 7/183; G06F 1/16; G06F 1/1601; G06F 1/1613; G06F 1/1633; G06F 1/18; G06F 1/189

USPC ..... 211/133.5, 26.2, 26, 87.01, 90.01, 90.02, 211/90.04, 193, 128.1, 126.9, 133.2, 211/133.1, 133.3; 108/106–108, 50.02; 320/107, 110–115; 312/23.2; 52/220.7; 361/679.01–679.45, 679.55–679.21, 361/724–727
See application file for complete search history.

(56) References Cited

U.S. PATENT DOCUMENTS

| | | | | |
|---|---|---|---|---|
| 4,489,995 A | * | 12/1984 | Barr | A47F 3/0447 312/116 |
| 4,662,524 A | * | 5/1987 | Fullenkamp | A47B 57/565 211/190 |
| 4,819,899 A | * | 4/1989 | Weil | A47F 5/01 211/133.2 |
| 4,930,047 A | * | 5/1990 | Peterson | H01R 25/003 200/51 R |

(Continued)

*Primary Examiner* — Jennifer E. Novosad
(74) *Attorney, Agent, or Firm* — Kyle A. Fletcher, Esq.

(57) ABSTRACT

The stackable shelf system for charging electrical devices is a furniture item. The stackable shelf system for charging electrical devices comprises a bracket, a plurality of shelves, and a power distribution circuit. The bracket provides vertical support for the plurality of shelves. The plurality of shelves forms a plurality of horizontal surfaces, which support and store one or more electrically powered devices. The power distribution circuit provides an ac port and a dc port to each shelf contained within the plurality of shelves. Each ac port and each dc port provide a source of electrical power for use by the one or more electrically powered devices. The power distribution circuit further comprises a daisy chain link that allows multiple instantiations of the stackable shelf system for charging electrical devices to be connected to an external power source using a single electrical connection.

17 Claims, 5 Drawing Sheets

(56) References Cited

U.S. PATENT DOCUMENTS

| | | | | |
|---|---|---|---|---|
| 5,022,720 A * | 6/1991 | Fevig | ............... | A47F 3/005 108/107 |
| 5,186,337 A * | 2/1993 | Foster | ............... | A61G 13/107 174/493 |
| 5,348,485 A * | 9/1994 | Briechle | ............... | H01R 25/14 439/110 |
| 5,425,648 A * | 6/1995 | Farham | ............... | H01R 25/16 439/116 |
| 5,452,807 A * | 9/1995 | Foster | ............... | A61G 13/107 211/168 |
| 5,779,069 A * | 7/1998 | Scully | ............... | A47B 96/02 211/153 |
| 5,794,794 A * | 8/1998 | Hull | ............... | H05K 7/18 211/187 |
| 6,008,621 A * | 12/1999 | Madison | ............... | H02J 7/0042 320/107 |
| 6,113,198 A * | 9/2000 | Honnnnes | ............... | A47B 57/485 211/26 |
| 6,158,599 A * | 12/2000 | Lazarus | ............... | A47B 57/42 211/187 |
| 6,173,847 B1 * | 1/2001 | Zellner, III | ............... | A47B 55/02 211/186 |
| 6,199,705 B1 * | 3/2001 | Portner | ............... | A47F 5/0846 211/26 |
| 6,747,204 B2 * | 6/2004 | Deland | ............... | H02G 3/288 174/101 |
| 7,055,833 B2 * | 6/2006 | Wixted | ............... | B62B 3/006 280/47.34 |
| 7,128,221 B2 * | 10/2006 | Metcalf | ............... | A47F 5/137 211/59.2 |
| 7,189,107 B1 * | 3/2007 | Strayer | ............... | H01R 13/6456 439/501 |
| 7,480,138 B2 | 1/2009 | Kogan | | |
| 7,588,152 B2 * | 9/2009 | Law | ............... | B63B 17/00 211/26.2 |
| 7,745,954 B1 * | 6/2010 | Menas | ............... | G06F 1/266 307/38 |
| 7,800,914 B2 * | 9/2010 | Dully | ............... | G06F 1/1632 361/756 |
| D665,387 S | 8/2012 | Hsiao | | |
| 9,030,828 B2 | 5/2015 | Lindblad | | |
| 9,130,385 B2 | 9/2015 | Chen | | |
| 9,148,977 B1 * | 9/2015 | Williams | ............... | A47B 47/021 |
| 9,263,869 B2 * | 2/2016 | Prince | ............... | H02B 1/52 |
| 9,357,858 B2 * | 6/2016 | Sun | ............... | A47F 5/0018 |
| 9,532,638 B2 * | 1/2017 | Davis | ............... | A45D 44/02 |
| 9,756,765 B1 * | 9/2017 | Michaud | ............... | H05K 7/20736 |
| 10,135,268 B1 * | 11/2018 | Gokcebay | ............... | H02J 7/0027 |
| 10,141,757 B2 * | 11/2018 | Mecca | ............... | H02J 7/0044 |
| 2003/0042868 A1 * | 3/2003 | Muramatsu | ............... | H02J 7/0044 320/107 |
| 2008/0116157 A1 * | 5/2008 | Fulbrook | ............... | A61M 5/1415 211/60.1 |
| 2008/0170355 A1 * | 7/2008 | Kyriakides | ............... | H02J 7/0027 361/626 |
| 2009/0157907 A1 * | 6/2009 | Chapman | ............... | H02J 7/0027 710/8 |
| 2009/0267564 A1 * | 10/2009 | Gerber | ............... | H02J 7/0027 320/114 |
| 2009/0278495 A1 * | 11/2009 | Kaye | ............... | H02J 7/0027 320/114 |
| 2010/0176762 A1 * | 7/2010 | Daymude | ............... | H02J 7/0027 320/115 |
| 2011/0121776 A1 * | 5/2011 | Lev | ............... | G06F 1/1632 320/107 |
| 2011/0133572 A1 * | 6/2011 | Levi | ............... | A45D 20/14 307/139 |
| 2014/0062390 A1 * | 3/2014 | Webber | ............... | H02J 7/0027 320/107 |
| 2014/0175031 A1 * | 6/2014 | Roberts | ............... | H02J 7/0027 211/26.2 |
| 2014/0209547 A1 * | 7/2014 | Villalobos | ............... | A47B 49/00 211/36 |
| 2015/0180246 A1 * | 6/2015 | Roth | ............... | H02J 7/0027 320/115 |
| 2016/0020625 A1 * | 1/2016 | Tsou | ............... | H02J 7/0044 320/115 |
| 2017/0047751 A1 * | 2/2017 | Fernandes | ............... | H02J 7/0044 |
| 2017/0155259 A1 * | 6/2017 | Mecca | ............... | H02J 7/0044 |

* cited by examiner

STACKABLE SHELF SYSTEM FOR CHARGING ELECTRICAL DEVICES

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of personal and domestic articles including furniture, more specifically, a rack adapted for a particular purpose.

SUMMARY OF INVENTION

The stackable shelf system for charging electrical devices is a furniture item. The stackable shelf system for charging electrical devices comprises a bracket, a plurality of shelves, and a power distribution circuit. The bracket provides vertical support to the plurality of shelves and forms the load path between the plurality of shelves and a supporting surface. The plurality of shelves forms a plurality of horizontal surfaces, which support and store one or more electrically powered devices. The power distribution circuit provides an ac port and a dc port to each shelf contained within the plurality of shelves. Each ac port and each dc port provide a source of electrical power for use by the one or more electrically powered devices. The power distribution circuit further comprises a daisy chain link that allows multiple instantiations of the stackable shelf system for charging electrical devices to be connected to an external power source using a single electrical connection.

These together with additional objects, features and advantages of the stackable shelf system for charging electrical devices will be readily apparent to those of ordinary skill in the art upon reading the following detailed description of the presently preferred, but nonetheless illustrative, embodiments when taken in conjunction with the accompanying drawings.

In this respect, before explaining the current embodiments of the stackable shelf system for charging electrical devices in detail, it is to be understood that the stackable shelf system for charging electrical devices is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the stackable shelf system for charging electrical devices.

It is therefore important that the claims be regarded as including such equivalent construction insofar as they do not depart from the spirit and scope of the stackable shelf system for charging electrical devices. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
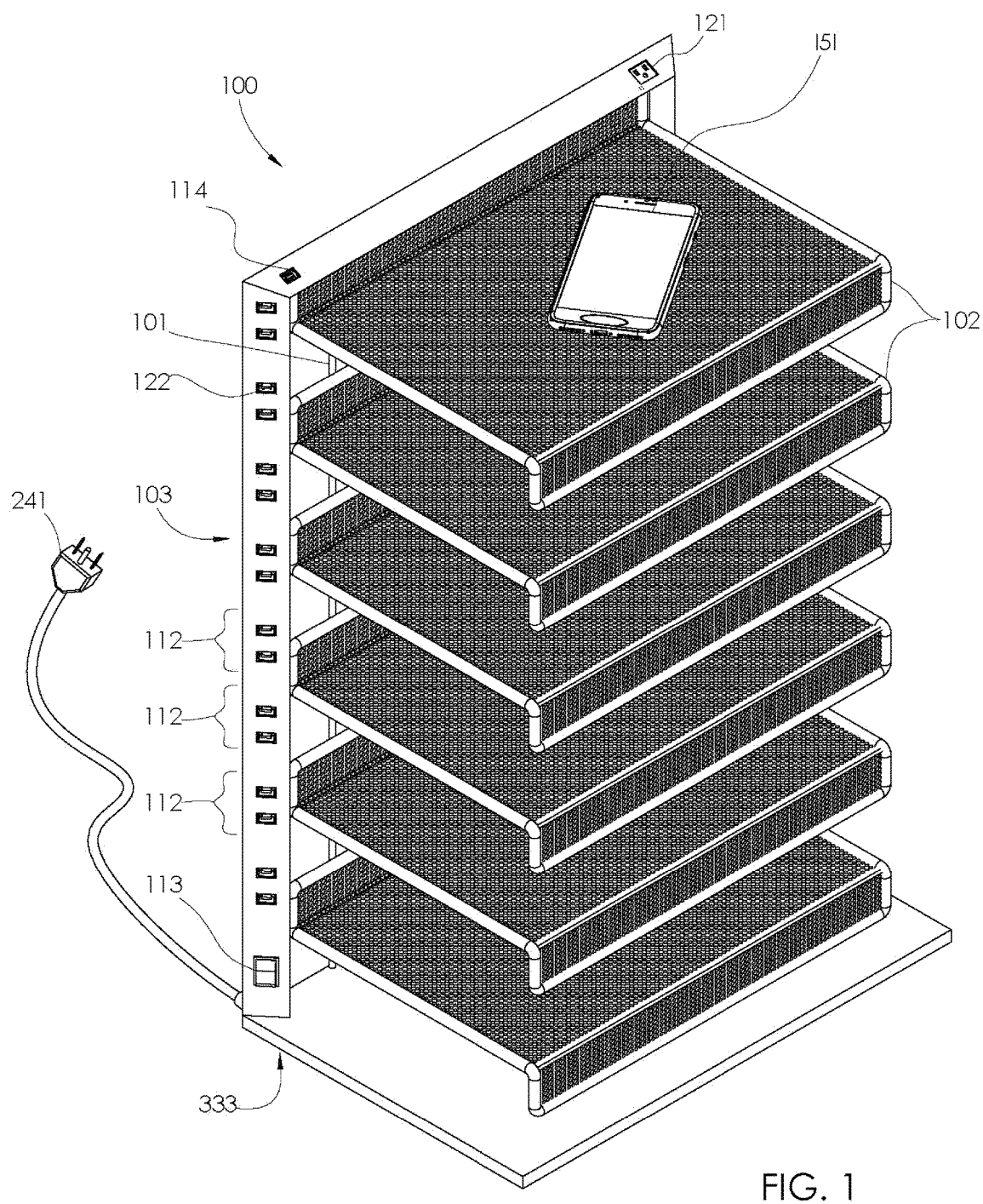
FIG. 1 is a perspective view of an embodiment of the disclosure.
Figure 2:
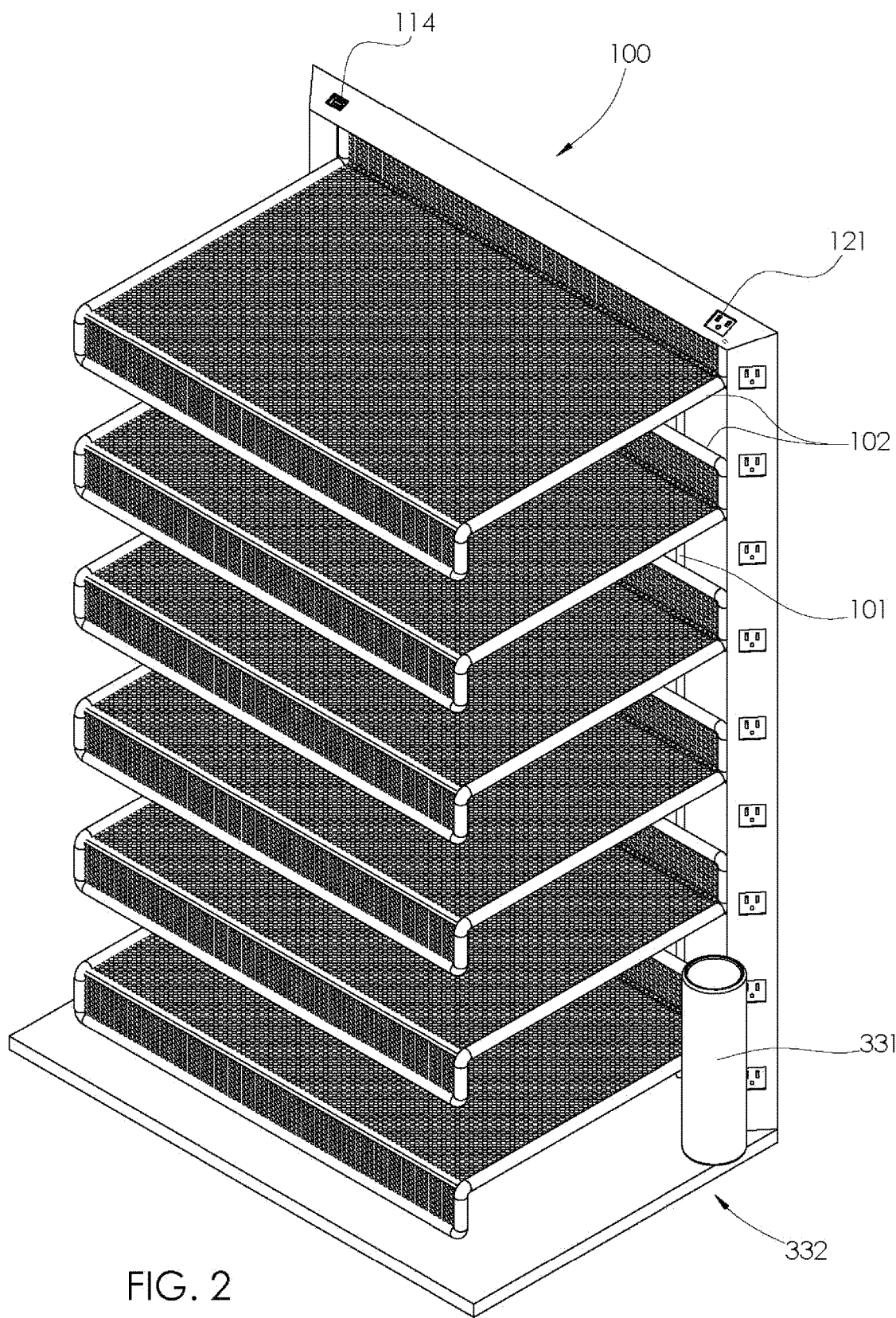
FIG. 2 is a perspective view of an embodiment of the disclosure.
Figure 3:
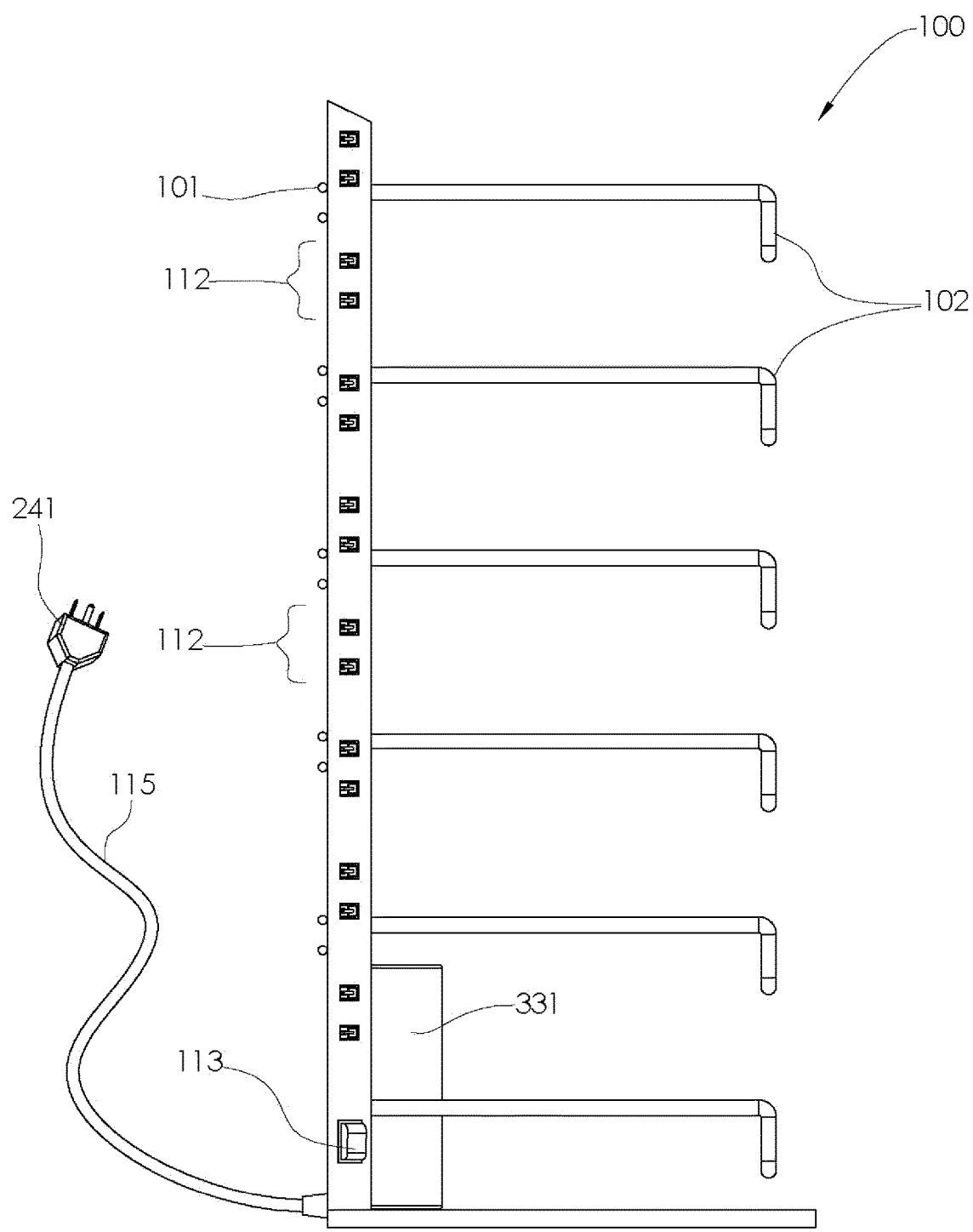
FIG. 3 is a side view of an embodiment of the disclosure.
Figure 4:
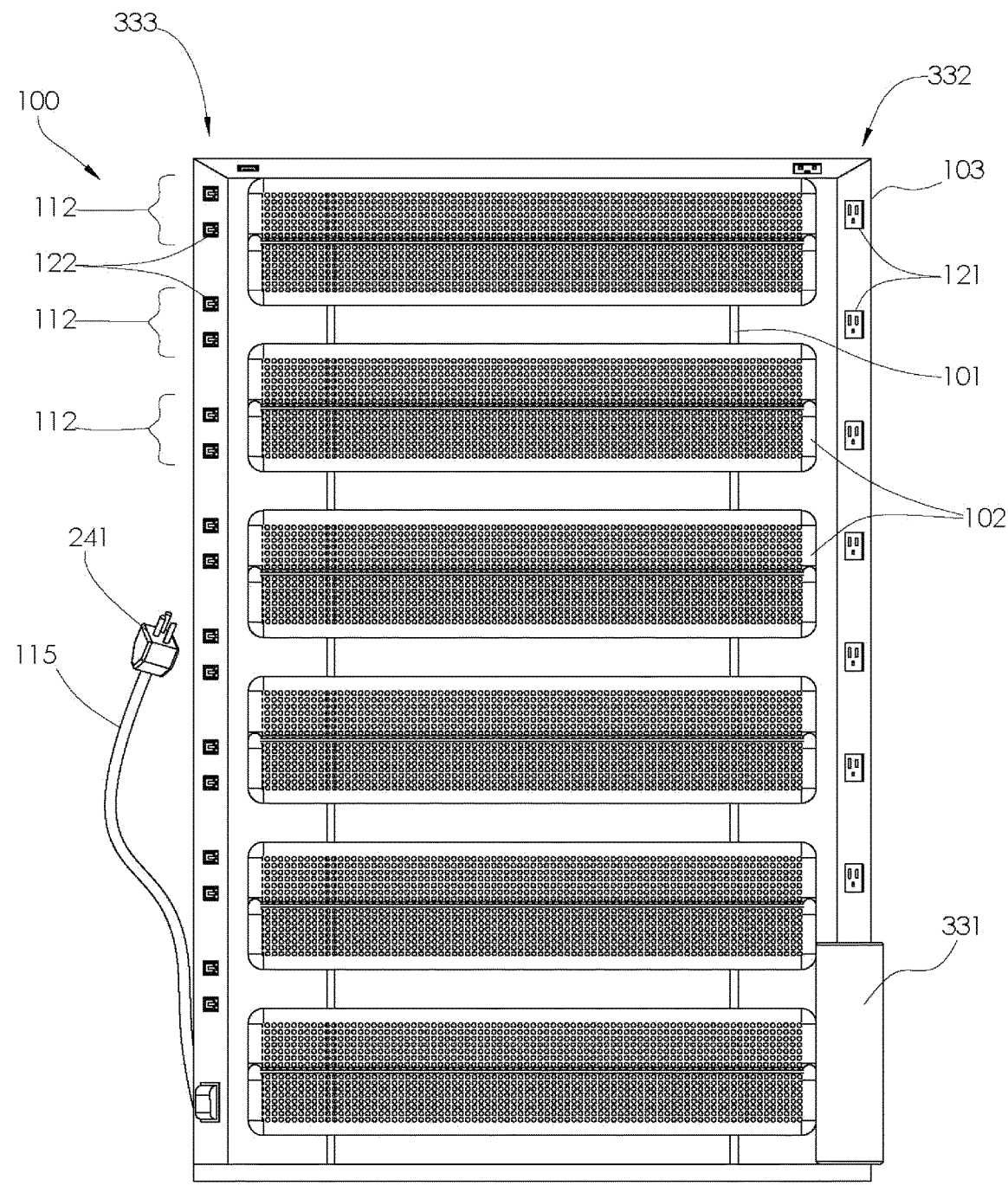
FIG. 4 is a front view of an embodiment of the disclosure.
Figure 5:
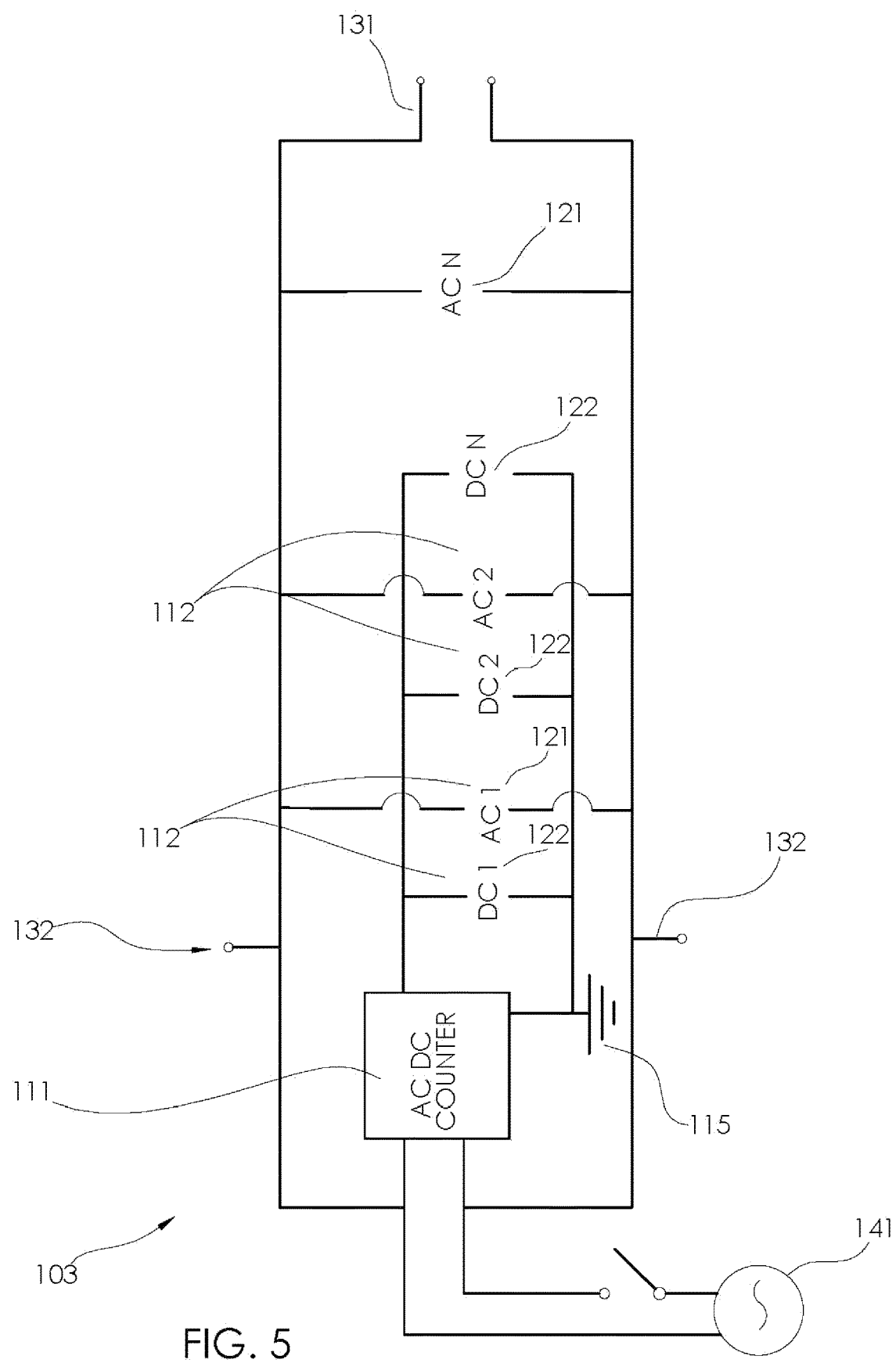
FIG. 5 is a schematic view of an embodiment of the disclosure.

Detailed reference will now be made to one or more potential embodiments of the disclosure, which are illustrated in FIGS. 1 through 5.

The stackable shelf system for charging electrical devices 100 (hereinafter invention) is a furniture item. The invention 100 comprises a bracket, a plurality of shelves 102, and a power distribution circuit 103. The bracket 101 provides vertical support to the plurality of shelves 102 and forms the load path between the plurality of shelves 102 and a supporting surface. The plurality of shelves 102 is configured for use with one or more electrically powered devices 151. The plurality of shelves 102 forms a plurality of horizontal surfaces, which support and store the one or more electrically powered devices 151. The power distribution circuit 103 further comprises a plurality of shelf stations 112. Each of the plurality of shelf stations 112 provides a source of both ac electrical power and dc electrical power for use by the one or more electrically powered devices 151. The power distribution circuit 103 further comprises a daisy chain link 114 that allows multiple instantiations of the invention 100 to be connected to an external power source 141 using a single electrical connection.

The external power source 141 is an externally provided source of ac electrical power. The first potential embodiment of the disclosure assumes that the external power source 141 is the national electric grid. A power plug 241 enables connection of the power distribution circuit 103 to the external power source 141. The first potential embodiment of the disclosure assumes that each of the one or more electrically powered devices 151 is an electrically powered device. Suitable electrically powered devices include, but are not limited to, personal data devices.

The bracket 101 is an openwork metal structure. The plurality of shelves 102 attach to the bracket 101 such that the bracket 101 vertically elevates the plurality of shelves 102. The bracket 101 style is selected from the group consisting of: 1) attaching the plurality of shelves 102 to a vertical surface such as a wall; and, 2) forming a pedestal that is placed on a horizontal surface such as a tabletop to support the plurality of shelves 102. Methods to form a bracket 101 as described in this paragraph are well known and documented in the mechanical arts.

Each of the plurality of shelves 102 is a horizontal surface that supports a device selected from the one or more electrically powered devices 151. The design and use of a shelf for storage purposes is well-known and documented in our society.

The power distribution circuit 103 is an electrical circuit. The power distribution circuit 103 of any first instantiation of the invention 100 draws power from an electrical source selected from the group consisting of: 1) the external power source 141; and, 2) a second instantiation of the invention 100. The power distribution circuit 103 conditions and distributes electrical energy from the selected electrical source to each shelf selected from the plurality of shelves 102. Each of the one or more electrically powered devices 151 draws power from the power distribution circuit 103 for operation and recharges. The power distribution circuit 103 provides each of the plurality of shelves 102 with both ac electrical power and dc electrical power.

The power distribution circuit 103 comprises an ac/dc converter 111, a plurality of shelf stations 112, a master switch 113, a daisy chain link 114, a connecting cable 115, and an electrical ground 116. The power distribution circuit 103 is configured to work with the external power source 141.

The ac/dc converter 111 is a commercially available electrical device. The ac/dc converter 111 converts ac electrical power into dc electrical power in the form of a regulated dc voltage. In the first potential embodiment of the disclosure, the ac/dc converter 111 generates dc voltages consistent for use with USB devices. The use of an ac/dc converter 111 is well-known and documented in the electrical arts.

The plurality of shelf stations 112 is a structure that delivers electrical power to each shelf selected from the plurality of shelves 102. There is a one to one correspondence between the plurality of shelf stations 112 and the plurality of shelves 102. Each shelf station selected from the plurality of shelf stations 112 delivers ac electrical power and dc electrical power to the shelf associated with the selected shelf station. Each shelf station selected from the plurality of shelf stations 112 is positioned such that the selected shelf station is readily accessible from the selected shelf. Each shelf station selected from the plurality of shelf stations 112 comprises an ac port 121 and a dc port 122.

The ac port 121 is provisioned with each of the plurality of shelf stations 112. The ac port 121 delivers ac electrical power for use by a device selected from the one or more electrically powered devices 151. The ac port 121 has a location proximal to the shelf associated with the selected shelf station. In the first potential embodiment of the disclosure, the ac port 121 is a NEMA 5-15 socket.

The dc port 122 is provisioned with each of the plurality of shelf stations 112. The dc port 122 delivers dc electrical power for use by a device selected from the one or more electrically powered devices 151. The dc port 122 has a location proximal to the shelf associated with the selected shelf station. In the first potential embodiment of the disclosure, the dc port 122 is a USB compatible port.

The master switch 113 is a commercially available maintained switch. The master switch 113 controls the flow of electricity from the selected electrical source into the power distribution circuit 103. The master switch 113 effectively operates as the power switch of the invention 100.

The daisy chain link 114 is an apparatus that electrically connects the power distribution circuit 103 of a first instantiation of the invention 100 to the power distribution circuit 103 of a second instantiation of the invention 100. The daisy chain link 114 transfers the power received from the selected electrical source to provide electrical power from the first instantiation of the invention 100 to the second instantiation of the invention 100. The use of the daisy chain link 114 allows multiple instantiations of the invention 100 to operate from a single connection to an external power source 141. The daisy chain link 114 comprises a daisy chain delivery termination 131 and a daisy chain receiving termination 132.

The daisy chain delivery termination 131 is an electrical terminal. The daisy chain delivery termination 131 provides access to ac electrical power from a first instantiation of the invention 100.

The daisy chain receiving termination 132 is an electrical terminal. The daisy chain receiving termination 132 is designed to power a second instantiation of the invention 100 by receiving power from the daisy chain delivery termination 131 of a first instantiation of the invention 100.

The connecting cable 115 is a commercially available cable that electrically connects the power distribution circuit 103 to the selected electrical source. Moreover, the connecting cable 115 includes the power plug 241 thereon. The electrical ground 116 is a reference voltage used within the DC power circuits. The electrical ground 116 is provisioned through the ac/dc converter 111.

The shelves 102 are ideally made of a metal with a mesh or hole pattern formed thereon. The mesh or hole pattern is depicted in the figures, and has an important function with the invention 100 in that the mesh or hole pattern enables heat of the one or more electrically powered devices 151 to pass through the shelves 102 so as to aid in lowering the overall temperature of the one or more electrically powered devices 151.

It shall be noted that the invention 100 may include a receptacle 331. The receptacle 331 is positioned adjacent to the shelves 102. The receptacle 331 is vertically-oriented, and able to store stylists or other items that are typically used with the one or more electrically powered devices 151.

It shall be noted that the power distribution circuit 103 extends vertically along both sides of the shelves 102. Moreover, the patent figures depict the power distribution circuit 103 extending along a left, top, and right side of the shelves such that the ac ports 121 are provided along a first side 332 of the shelves 102; whereas the dc ports 122 are provided along a second side 333 of the shelves 102.

The following definitions were used in this disclosure:

AC: As used in this disclosure, AC is an acronym for alternating current.

AC/DC Converter: As used in this disclosure, an AC/DC converter is an electrical device that converts an AC voltage into a regulated DC voltage. Method to design and build AC/DC converters are well-known in the electrical arts.

Align: As used in this disclosure, align refers to an arrangement of objects that are: 1) arranged in a straight plane or line; 2) arranged to give a directional sense of a plurality of parallel planes or lines; or, 3) a first line or curve is congruent to and overlaid on a second line or curve.

Bracket: As used in this disclosure, a bracket is a mechanical structure that attaches a second structure to a first structure such that the load path of the second structure is fully transferred to the first structure.

Cable: As used in this disclosure, a cable is a collection of insulated wires covered by a protective casing used for transmitting electricity or telecommunication signals.

Correspond: As used in this disclosure, the term correspond means that a first object is in some manner linked to a second object in a one to one relationship.

Daisy Chain: As used in this disclosure, daisy chain is a term that describes a series of objects that are linked together in a linear fashion.

DC: As used in this disclosure, DC is an acronym for direct current.

Electrical Ground: As used in this disclosure, an electrical ground is a common reference voltage used in the design and implementation of electrical circuits. An electrical ground is often, but not necessarily, the discharge point of electric currents flowing through an electric circuit.

External Power Source: As used in this disclosure, an external power source is a source of the energy that is externally provided to enable the operation of the present disclosure. Examples of external power sources include, but are not limited to, electrical power sources and compressed air sources.

Horizontal: As used in this disclosure, horizontal is a directional term that refers to a direction that is either: 1) parallel to the horizon; 2) perpendicular to the local force of gravity, or, 3) parallel to a supporting surface. In cases where the appropriate definition or definitions are not obvious, the second option should be used in interpreting the specification. Unless specifically noted in this disclosure, the horizontal direction is always perpendicular to the vertical direction.

Load Path: As used in this disclosure, a load path refers to a chain of one or more structures that transfers a load generated by a raised structure or object to a foundation, supporting surface, or the earth.

Logical Device: As used in this disclosure, a logical device is an electrical device that processes externally provided inputs to generate outputs determined from previously determined logical functions. A logical device may or may not be programmable.

Maintained Switch: A used in this disclosure, a maintained switch is a switch that maintains the position that was set in the most recent switch actuation. A maintained switch works in an opposite manner to a momentary switch.

National Electric Grid: As used in this disclosure, the national electric grid is a synchronized and highly interconnected electrical network that distributes energy in the form of electric power from a plurality of generating stations to consumers of electricity.

NEMA 5-15 Electrical Socket: As used in this disclosure, the NEMA 5-15 electrical socket is a port designed to provide electric power drawn from the National Electric Grid. The NEMA 5-15 electrical socket is commonly used to deliver electrical power to electric devices in residential, office, and light industrial settings. The NEMA 5-15 electrical socket is also commonly referred to as an electrical outlet.

One to One: When used in this disclosure, a one to one relationship means that a first element selected from a first set is in some manner connected to only one element of a second set. A one to one correspondence means that the one to one relationship exists both from the first set the second set and from the second set to the first set. A one to one fashion means that the one to one relationship exists in only one direction.

Openwork: As used in this disclosure, the term open work is used to describe a structure, often a surface, which is formed with openings that allow for visibility and airflow through the structure. Wrought work and meshes are forms of openwork.

Pedestal: As used in this disclosure, a pedestal is an intermediary load bearing structure that that transfers a load path between a supporting surface and an object, structure, or load.

Personal Data Device: As used in this disclosure, a personal data device is a handheld logical device used for managing personal information and communication. Examples of personal data device include, but are not limited to, cellular phones, tablets, laptop computers, and smartphones.

Plug: As used in this disclosure, a plug is an electrical termination that electrically connects a first electrical circuit to a second electrical circuit or a source of electricity. As used in this disclosure, a plug will have two or three metal pins.

Port: As used in this disclosure, a port is an electrical termination that is used to connect a first electrical circuit to a second external electrical circuit. In this disclosure, the port is designed to receive a plug.

Regulated Voltage: As used in this disclosure, a regulated voltage refers to a source of DC voltage that incorporates circuitry that reduces changes in output voltages that occur in response to changes to the circuit's input power supply voltage or to changes in output, or load, current.

Supporting Surface: As used in this disclosure, a supporting surface is a horizontal surface upon which an object is placed and to which the load path of the object is transferred. This disclosure assumes that the object is placed on the supporting surface in an orientation that is appropriate for the normal or anticipated use of the object.

Switch: As used in this disclosure, a switch is an electrical device that starts and stops the flow of electricity through an electric circuit by completing or interrupting an electric circuit. The act of completing or breaking the electrical circuit is called actuation. Completing or interrupting an electric circuit with a switch is often referred to as closing or opening a switch respectively. Completing or interrupting an electric circuit is also often referred to as making or breaking the circuit respectively.

Terminal: As used in this disclosure, a terminal is the end point of a conductor. A terminal can be the conducting wire itself or may have attached to is a device designed to facilitate an electrical connection.

USB: As used in this disclosure, USB is an acronym for Universal Serial Bus, which is an industry standard that defines the cables, the connectors, the communication protocols and the distribution of power required for interconnections between electronic devices. The USB standard defines several connectors including, but not limited to, USB-A, USB-B, mini-USB, and micro USB connectors.

Vertical: As used in this disclosure, vertical refers to a direction that is either: 1) perpendicular to the horizontal direction; 2) parallel to the local force of gravity; or, 3) when referring to an individual object the direction from the designated top of the individual object to the designated bottom of the individual object. In cases where the appropriate definition or definitions are not obvious, the second option should be used in interpreting the specification. Unless specifically noted in this disclosure, the vertical direction is always perpendicular to the horizontal direction.

With respect to the above description, it is to be realized that the optimum dimensional relationship for the various components of the invention described above and in FIGS. 1 through 5 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A rack adapted for a particular purpose comprising:
a bracket, a plurality of shelves, and a power distribution circuit;
wherein the plurality of shelves attach to the bracket;
wherein the plurality of shelves is configured for use with one or more electrically powered devices;
wherein each of the plurality of shelves is a horizontal surface that supports a device selected from the one or more electrically powered devices;
wherein the power distribution circuit provides a source of both ac electrical power and dc electrical power for use by the one or more electrically powered devices;
wherein the power distribution circuit further comprises a daisy chain link that allows multiple instantiations of the rack adapted for a particular purpose to be connected to an external power source using a single electrical connection;
wherein the external power source is an externally provided source of ac electrical power;
wherein each shelf selected from each of the plurality of shelves comprises an ac port and a dc port;
wherein the ac port electrically connects to the external power source;
wherein the dc port electrically connects to an ac/dc converter;
wherein the power distribution circuit extends along a left, top, and right side of the shelves;
wherein the ac port is provided along a first one of the left, top, and right sides of the plurality of shelves;
wherein the dc port is provided along a second one of the left, top, and right sides of the plurality of shelves.

2. The rack adapted for a particular purpose according to claim 1
wherein the bracket is an openwork metal structure;
wherein the plurality of shelves attach to the bracket such that the bracket vertically elevates the plurality of shelves.

3. The rack adapted for a particular purpose according to claim 2
wherein the power distribution circuit is an electrical circuit;
wherein the power distribution circuit is configured to work with the external power source.

4. The rack adapted for a particular purpose according to claim 3 wherein the power distribution circuit of any first instantiation of the rack adapted for a particular purpose draws power from an electrical source selected from the group consisting of: C) the external power source; and, D) a second instantiation of the rack adapted for a particular purpose.

5. The rack adapted for a particular purpose according to claim 4 wherein the power distribution circuit provides both ac electrical power and dc electrical power.

6. The rack adapted for a particular purpose according to claim 5
wherein the power distribution circuit comprises an ac/dc converter, a plurality of shelf stations, a master switch, a daisy chain link, a connecting cable, and an electrical ground;
wherein the electrical ground is a reference voltage.

7. The rack adapted for a particular purpose according to claim 6
wherein the ac/dc converter is an electrical device;
wherein the ac/dc converter converts ac electrical power from the electrical source into dc electrical power in the form of a regulated dc voltage.

8. The rack adapted for a particular purpose according to claim 7
wherein each of the plurality of shelf stations is a structure that delivers electrical power to each shelf selected from the plurality of shelves;
wherein there is a one to one correspondence between the plurality of shelf stations and the plurality of shelves;
wherein each shelf station selected from the plurality of shelf stations delivers ac electrical power and dc electrical power to the shelf associated with the selected shelf station.

9. The rack adapted for a particular purpose according to claim 8 wherein each shelf station selected from the plurality of shelf stations is positioned such that the selected shelf station is accessible from the associated selected shelf.

10. The rack adapted for a particular purpose according to claim 9
wherein the ac port delivers ac electrical power for use by a device selected from the one or more electrically powered devices;
wherein the ac port has a location proximal to the shelf associated with the selected shelf station.

11. The rack adapted for a particular purpose according to claim 10
wherein the dc port delivers dc electrical power for use by a device selected from the one or more electrically powered devices;
wherein the dc port has a location proximal to the shelf associated with the selected shelf station.

12. The rack adapted for a particular purpose according to claim 11
wherein the master switch is a maintained switch;
wherein the master switch controls the flow of electricity into the power distribution circuit.

13. The rack adapted for a particular purpose according to claim 12
wherein the daisy chain link is an apparatus that electrically connects the power distribution circuit of a first instantiation of the rack adapted for a particular purpose to the power distribution circuit of a second instantiation of the rack adapted for a particular purpose;

wherein the daisy chain link transfers the power received from the selected electrical source to provide electrical power from the first instantiation of the rack adapted for a particular purpose to the second instantiation of the rack adapted for a particular purpose.

14. The rack adapted for a particular purpose according to claim 13 wherein the daisy chain link comprises a daisy chain delivery termination and a daisy chain receiving termination;

wherein the daisy chain delivery termination is an electrical terminal;

wherein the daisy chain receiving termination is an electrical terminal.

15. The rack adapted for a particular purpose according to claim 14 wherein the daisy chain delivery termination of a first instantiation of the rack adapted for a particular purpose electrically connects to the daisy chain receiving termination of a second instantiation of the rack adapted for a particular purpose;

wherein the daisy chain receiving termination powers the second instantiation of the rack adapted for a particular purpose by receiving power from the daisy chain delivery termination of the first instantiation of the rack adapted for a particular purpose;

wherein the connecting cable electrically connects the power distribution circuit to the selected electrical source;

wherein the ac port is a NEMA 5-15 socket;

wherein the dc port is a USB compatible port.

16. The rack adapted for a particular purpose according to claim 15 wherein the shelves are constructed of a metal mesh, which enables heat of the one or more electrically powered devices to pass through the shelves;

wherein a receptacle is positioned adjacent to the shelves;

wherein the receptacle is vertically-oriented, and able to store stylists or other items that are typically used with the one or more electrically powered devices.

17. The rack adapted for a particular purpose according to claim 3 wherein the power distribution circuit conditions and distributes electrical energy from the selected electrical source to the one or more electrically powered devices;

wherein each of the one or more electrically powered devices draws power from the power distribution circuit for operation and recharges.

\* \* \* \* \*